United States Patent

Dütting et al.

[11] Patent Number: 5,995,530
[45] Date of Patent: Nov. 30, 1999

[54] INTERFEROMETRIC SEMICONDUCTOR LASER WITH LOW-LOSS COUPLING OF LIGHT THEREFROM AND AN ARRANGEMENT WITH SUCH A LASER

[75] Inventors: Kaspar Dütting, Stuttgart; Klaus Wünstel, Schwieberdigen, both of Germany

[73] Assignee: Alcatel N.V., Rijswijk, Netherlands

[21] Appl. No.: 08/762,118

[22] Filed: Dec. 9, 1996

Related U.S. Application Data

[63] Continuation of application No. 08/458,028, Jun. 1, 1995, abandoned.

[30] Foreign Application Priority Data

Jun. 17, 1994 [DE] Germany ............... 44 21 043

[51] Int. Cl.$^6$ .................................................. H01S 3/085
[52] U.S. Cl. ................................ 372/50; 372/97; 385/45
[58] Field of Search .................... 385/45, 46.47, 385/130, 14; 372/92, 97, 50, 6; 359/27

[56] References Cited

U.S. PATENT DOCUMENTS

| | | | |
|---|---|---|---|
| 4,831,631 | 5/1989 | Haeussler et al. | 372/6 |
| 4,887,877 | 12/1989 | Inoue et al. | 385/14 |
| 5,319,667 | 6/1994 | Dutting et al. | 372/97 |

FOREIGN PATENT DOCUMENTS 0418705  3/1991  European Pat. Off. .

OTHER PUBLICATIONS

Essay by M. Schilling et al. on "6 THz Range Tunable 2.5 Gb/s Frequency Conversion by a Multiquantum Well Y Laser", in IEEE Journal of Quantum Electronics, vol. 26, No. 6, Jun. 1993.

Essay by K. Stubkjaer et al. on "Semiconductor Optical Amplifiers as Linear Amplifiers Gates and Wavelength Converters", reported to public at ECOC'93, 19th European Conf. Optical Commun., Sep. 12–16, 1993 in Montreux, Switzerland, pp. 60–67.

J. Salzman et al. Cross–Coupled Cavity Semiconductor Laser, Applied Physics Letters, Bd. 52, No. 10, Mar. 7, 1988, New York, US, pp. 767–769.

Patent Abstracts of Japan, vol. 010, No. 133 (E–404), May 17, 1986 & JP=A–60 263488 (Matsushita Denki Sangyo KK), Dec. 26, 1985.

"Photonic FDM Highway Switch Using PLC Ring Resonators", Conference Paper from ECOC'93 (19th European Conference Optical Comm. in Montreux, Switzerland), Sep. 12–16, 1993 by Koji Sasayama, Keishi Habara, Japan.

*Primary Examiner*—James W. Davie
*Attorney, Agent, or Firm*—Ware, Fressola, Van Der Sluys & Adolphson LLP

[57] ABSTRACT

An interferometric semiconductor laser (YL) as well as optoelectronic arrangements with such a laser are disclosed. The laser has a special coupling segment (Z) which allows high optical output to be obtained without affecting the filtering function or significantly restricting the tuning range of the laser. Such a laser can be coupled with low loss to a subsequent optoelectronic component (e.g., a wavelength converter (WK)) which is monolithically integrated with the laser.

18 Claims, 1 Drawing Sheet

INTERFEROMETRIC SEMICONDUCTOR LASER WITH LOW-LOSS COUPLING OF LIGHT THEREFROM AND AN ARRANGEMENT WITH SUCH A LASER

This is a continuation of application Ser. No. 08/458,028 filed on Jun. 1, 1995, now abandoned.

TECHNICAL FIELD

The invention concerns an interferometric semiconductor laser and arrangements with such a laser.

BACKGROUND OF THE INVENTION

Interferometric lasers can emit light over a wide range of wavelengths. If designed and wired in a suitable manner, they are electrically tunable over a wavelength range of more than 50 nm and are therefore ideally suited for many tasks in optical communications. An article by M. Schilling et al in IEEE Journal of Quantum Electronics, Vol. 26, No. 6, June 1993, describes an asymmetric Y-laser in detail.

Interferometric lasers contain at least 3 mirrors or reflection areas. These are required for the respective laser's internal filtering function. Both diescrete coupling and monolithic coupling of a waveguide to one of the mirrors requires a semiconductor-air-semiconductor transition, which is subject to large coupling losses. If during monolithic integration a more efficient transition is provided at one of the 3 mirrors, e.g. by a reflection grating area in a continuous or butt-coupled waveguide, the filtering function of the loser will be affected and its original wide tuning range will be restricted.

SUMMARY OF THE INVENTION

It is, therefore, an object of the invention to provide an interferometric laser from which higher optical output can be obtained without affecting the filtering function of the laser, and thus its wavelength stability, or appreciably restricting its tuning range.

The interferometric laser of the invention contains at least one additional light output segment, which branches out from a coupling segment and is terminated by a substantially reflectionless termination. This provides a loss output through which high optical power can be extracted from the laser without changing its filtering characteristics. This makes it possible to couple the laser to other optoelectronic components, even without interposing an optical amplifier, by using passive waveguides. In addition, lossy optical transitions, such as butt (end-fire) couplings or couplings through glass fiber sections as are required in hybrid optoelectronic circuits, can now be avoided in many cases by monolithic integration of the interferometric laser with subsequent components. A Y-laser is particularly advantageous if it has, besides the coupling segment, at least two arm segments and a root segment, with the coupling segment interconnecting at least two arm segments and the root segment.

Another object of the invention is to provide optoelectronic arrangements in which the interferometric laser of the invention can be used to advantage.

In such arrangements, particularly when these are monolithically integrated, the subsequent optoelectronic component can be supplied with sufficient optical power of an adjustable wavelength in a simple manner.

An arrangement can be established that allows nearly loss-free transmission of the high optical power extracted from the laser to the subsequent optoelectronic component.

In addition, arrangements can be established in which particular optoelectronic components are optically coupled to the laser of the invention, thereby attaining special advantages.

The latter applies particularly to an arrangement where the subsequent optoelectronic component is a wavelength converter or an interferometric wavelength converter. Such wavelength converters comprise one or more semiconductor optical amplifiers (SOAs) and are described, for example, in an essay by a group of authors from the Lyngby Technical University, Denmark, and the Research Center of Alcatel Alsthom at Marcoussis, France, which was presented at the ECOC'93 (19th European Conference on Optical Communication, Sep. 12–16, 1993, Montreux), and is also available as an official record of the conference (Proceedings, Vol. 1, pages 60 to 67).

Since the transmission speed of such wavelength converters used for optical communications is determined by the rate of change in the index of refraction, such converters are extremely fast and may outperform a laser, whose transmission speed is limited by its resonance frequency.

Arrangements in which a continuously tunable Y-laser with a light output segment delivers sufficiently high optical power to such a wavelength converter are therefore ideally suited for distributing information to a plurality of wavelength channels.

However, other optoelectronic components, e.g. optical space switches and optical memories, can also be advantageously coupled to an interferometric laser according to the invention.

BRIEF DESCRIPTION OF THE DRAWINGS

Embodiments of the interferometric semiconductor laser of the invention and of optoelectronic arrangements comprising such a laser will now be described in detail with reference to the accompanying drawings, in which.

BEST MODE FOR CARRYING OUT THE INVENTION

Figure 1A:
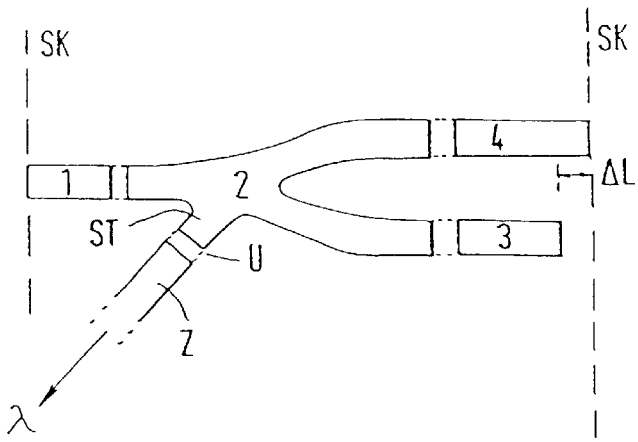
FIG. 1a shows one embodiment of a Y-laser that is the subject matter of the present invention.

FIGS. 1a and b illustrate interferometric lasers according to the invention. In these embodiments, the lasers are so-called Y-lasers as are known from the above-cited article by M. Schilling, which were provided with a light output segment Z. The light output segment starts at a coupling segment 2 of the Y-laser, which connects the other segments, namely the root segment 1 and the arm segments 3 and 4, with one another, and ends reflection-free at the transition to a subsequent optoelectronic component (not shown in FIG. 1), which receives light from the Y-laser.

Instead of the Y-laser, any other interferometric laser can be used, e.g. a cross-shaped laser. The number of laser segments—in this case the minimum number 4—can also be greater. Further additional light output segments may be provided and used independently of each other for coupling out light. The arm segments 3, 4 of the Y-laser, which in this case are of different lengths in order to obtain different resonance frequencies in the light paths in the two arms, which are required to produce the Mach-Zehnder effect, may also be of the same length. The required asymmetry can be produced by flowing different currents through the arm segments.

As with the other segments of the Y-laser, the form and size of the light output segment Z are determined by the waveguiding and beam splitting of one or more modes which exhibits the lowest loss. The length of the metal electrode plays a subordinate role and can be chosen in accordance with the length of the other segment electrodes.

An electrical discontinuity U between the electrodes of the light output segment Z and the coupling segment 2 of the Y-laser may be provided directly at the coupling segment of the conventionally shaped Y-laser, but may also be located at a distance from that segment, in which case the latter is provided with a stub ST, to which the light output segment is connected.

Figure 1B:
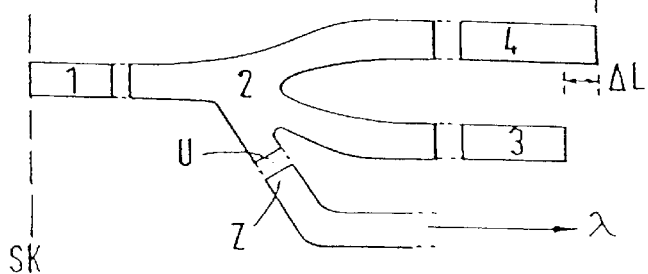
FIG. 1b shows another embodiment of a Y-laser that is the subject matter of the present invention.

As can be seen in FIGS. 1a and 1b, the light output segments may point in any direction, but they always start at coupling segment 2, since only there can high optical output be obtained without appreciably disturbing the resonance conditions of the laser cavities.

Figure 2:
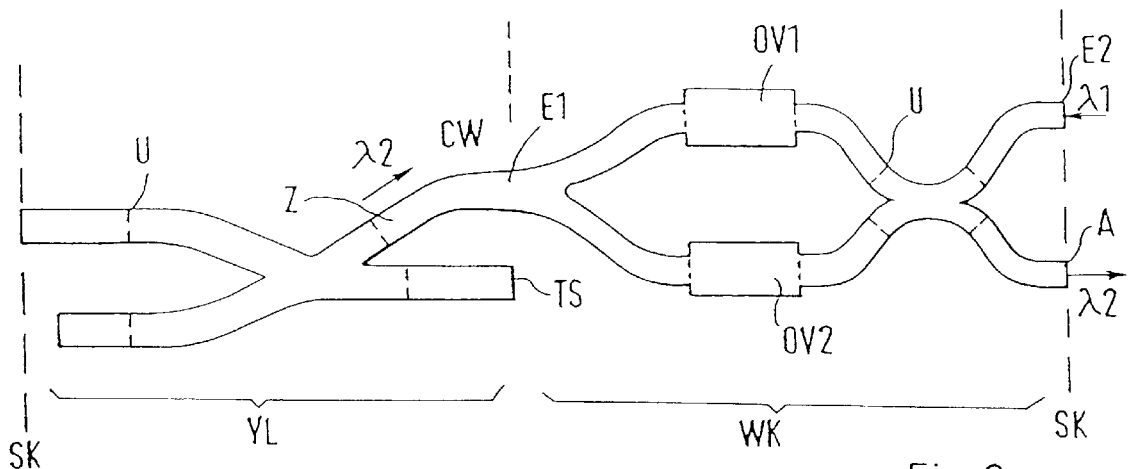
FIGS. 2 and 3 show two monolithic integrated optoelectronic arrangements with one Y-laser and one wavelength converter each.

FIG. 2 depicts a monolithic integrated optoelectronic arrangement in which an interferometric laser YL is optically coupled to a wavelength converter WK. However, the combination of interferometric laser and wavelength converter is not the only arrangement of this kind that can be used in optical communications. The advantages of an interferometric laser with a light output segment, i.e., of a powerful light source which can be coupled with low loss and is well suited for monolithic integration, also apply to combinations with other optoelectronic components, particularly optical space switches and semiconductor optical memories, such as planar-lightwave-circuit (PLC) ring resonators as described in Proceedings of ECOC'93, page 545 to 548. The coupling of the interferometric laser to such components does not differ in principle from the coupling to a wavelength converter as described in conjunction with FIGS. 2 and 3.

The interferometric Y-laser illustrated in FIG. 2, which corresponds approximately to the Y-laser illustrated in FIG. 1a, feeds continuous light CW at wavelength λ2 into an input E1 of the wavelength converter WK. Modulated light at wavelength λ1 is fed into another input E2 of the wavelength converter. Modulated light at wavelength λ2 can be obtained from output A of the wavelength converter. For the wavelength converter, a Mach-Zehnder configuration of two semiconductor optical amplifiers OV1, OV2 has been chosen here, which corresponds to FIG. 10 of the essay cited above. However, any other form of a wavelength converter can be used.

The Y-laser is coupled to the wavelength converter through a continuous, unperturbed optical waveguide nearly loss-free. The mirrored end faces of the Y-laser are preferably formed by the cleaved faces SK of the monolithic integrated component. Where this is not possible, mirrored end faces TS can be produced by dry etching.

In the wavelength converter, as in the Y-laser, electrically separately controllable segments are provided by means of electrical discontinuities U in the metal electrodes overlying the optical waveguide cavities.

Where the discontinuities are located depends on the number and location of the respective points where control is to be effected.

To prevent the interferometric laser from being disturbed by back reflections, the end faces of the component connected to the laser should be antireflection coated. If antireflection coating is not possible, care must be taken to ensure that the difference between the optical path lengths of the laser arms is much smaller than the difference between the optical path length of the laser's root segment and the optical path length of the subsequent optoelectronic component. In the configuration of a wavelength converter shown in FIG. 2, the modulated light of wavelength λ1 fed into the second input of the wavelength converter may interfere with the operation of the interferometric laser. The laser must therefore provide "hard" filtering action at the wavelength λ2.

Figure 3:
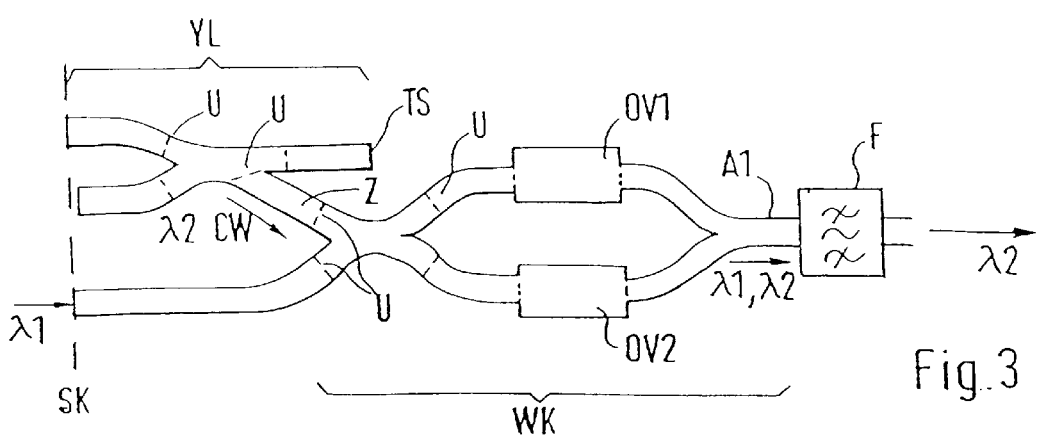

The last-mentioned problem does not arise in the arrangement illustrated in FIG. 3, since in this case the modulated light of wavelength λ1 is injected parallel to the continuous light signal of the laser. But at output A1 of the wavelength converter, two modulated signals of wavelengths λ1 and λ2 are present. To obtain the modulated signal at wavelength λ2 by itself, output A1 must be followed by a wavelength filter F.

What is claimed is:

1. An interferometric semiconductor laser (YL) having several independently controllable segments (1 . . . 4) and a coupling segment (2) connected to several segments, characterized by at least one additional light output segment (Z) which is connected to the coupling segment and is terminated at its end remote from the coupling segment by a termination which is substantially reflectionless compared with respective terminations of the several independently controllable segments (1 . . . 4) remote from the coupling segment (2).

2. An interferometric semiconductor laser as claimed in claim 1, characterized in that it is shaped like a Y and has, besides the coupling segment (2), at least two arm segments (3, 4) and a root segment (1), and that the coupling segment interconnects at least two arm segments and the root segment.

3. An arrangement comprising an interferometric laser as claimed in claim 2, characterized in that at its end remote from the coupling segment, the light output segment (Z) of the interferometric laser is optically coupled to a subsequent optoelectronic component (AK).

4. An arrangement as claimed in claim 3, characterized in that the interferometric laser and the subsequent optoelectronic component are monolithically integrated.

5. An arrangement as claimed in claim 4, characterized in that the light output segment and that portion of the subsequent optoelectronic component into which optical power is coupled from the light output segment form a continuous, unperturbed optical waveguide in the coupling region.

6. An arrangement as claimed in claim 3, characterized in that the light output segment and that portion of the subsequent optoelectronic component into which optical power is coupled from the light output segment are optically coupled by end-fire coupling or hybrid coupling.

7. An arrangement as claimed in claim 6, characterized in that the subsequent component is an optical space switch.

8. An arrangement as claimed in claim 6, characterized in that the subsequent component is an optical memory.

9. An arrangement as claimed in claim 6, characterized in that the subsequent optoelectronic component is a wavelength converter.

10. An arrangement as claimed in claim 9, characterized in that the wavelength converter is an interferometric wavelength converter.

11. An arrangement comprising an interferometric laser as claimed in claim 1, characterized in that at its end remote from the coupling segment, the light output segment (Z) of the interferometric laser is optically coupled to a subsequent optoelectronic component (WK).

12. An arrangement as claimed in claim 11, characterized in that the subsequent component is an optical space switch.

13. An arrangement as claimed in claim 3, characterized in that the subsequent component is an optical space switch.

14. An arrangement as claimed in claim 11, characterized in that the subsequent component is an optical memory.

15. An arrangement as claimed in claim 3, characterized in that the subsequent component is an optical memory.

16. An arrangement as claimed in claim 11, characterized in that the subsequent optoelectronic component is a wavelength converter.

17. An arrangement as claimed in claim 3, characterized in that the subsequent optoelectronic component is a wavelength converter.

18. An interferometric semiconductor Y-laser (YL) having a root segment (1), a first arm segment (3), a second arm segment (4) and a coupling segment (2) for connecting the root segment (1) to the first arm segment (3) and the second arm segment (4), characterized in that the interferometric semiconductor Y-laser (YL) further comprises at least one additional output segment (Z) which is connected to the coupling segment (2) and is terminated at a remote end from the coupling segment (2) by a substantially reflectionless termination for providing a loss output through which high power optical power can be extracted without changing filtering characteristics of the interferometric semiconductor Y-laser (YL), the substantially reflectionless termination being substantially reflectionless compared with respective terminations of the root segment (1), the first arm segment (3) and the second arm segment (4) remote from the coupling segment (2).

* * * * *

UNITED STATES PATENT AND TRADEMARK OFFICE
CERTIFICATE OF CORRECTION

PATENT NO : 5,995,530
DATED : November 30, 1999
INVENTOR(S): Dütting et al.

It is certified that error appears in the above-identified patent and that said Letters Patent is hereby corrected as shown below:

On the Title page, item [75], under Inventors, please delete "Schwieberdigen" and insert --Schwieberdingen--.

In column 4, line 41 (claim 3, line 5), "(AK)" should be --(WK)--.

Signed and Sealed this

Eighth Day of August, 2000

Attest:

Attesting Officer

Q. TODD DICKINSON
Director of Patents and Trademarks